United States Patent
Khan et al.

(10) Patent No.: US 9,450,518 B2
(45) Date of Patent: Sep. 20, 2016

(54) ON-CHIP POWER CONVERTER CIRCUIT AND ON-CHIP POWER SUPPLY USING THE POWER CONVERTER CIRCUIT

(71) Applicant: UNIVERSITY OF UTAH RESEARCH FOUNDATION, Salt Lake City, UT (US)

(72) Inventors: Faisal Khan, Salt Lake City, UT (US); Abusaleh Imtiaz, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 105 days.

(21) Appl. No.: 13/801,645

(22) Filed: Mar. 13, 2013

(65) Prior Publication Data
US 2014/0266144 A1    Sep. 18, 2014

(51) Int. Cl.
*H02M 3/335*   (2006.01)
*H03H 9/00*    (2006.01)
*H02M 7/538*   (2007.01)
*H03H 9/17*    (2006.01)
*H02M 7/48*    (2007.01)

(52) U.S. Cl.
CPC ..... *H02M 7/538* (2013.01); *H02M 2007/4815* (2013.01); *H03H 9/173* (2013.01); *Y02B 70/1441* (2013.01)

(58) Field of Classification Search
CPC .......... H02M 3/335; H02M 3/33507; H02M 3/33515; H02M 3/33523; H02M 3/3376; H02M 3/33546; H02M 7/48; H02M 7/537; H02M 7/5387; H02M 7/53871; H02M 7/5388; H02M 7/539; H02M 7/538; H02M 7/53803; H02M 2007/4803; H02M 2007/4815; H02M 2007/4818; Y02B 70/1416; Y02B 70/1441; H03H 9/15; H03H 9/17; H03H 9/171; H03H 9/172; H03H 9/173; H03H 9/174; H03H 9/175
USPC ........ 323/222–226, 271–275, 282–286, 351, 323/355–370, 205–211; 363/15–17, 33, 363/123–127, 21.01–21.03, 40–48, 363/131–134; 333/133, 186–201; 310/321, 310/322, 324
See application file for complete search history.

(56) References Cited

U.S. PATENT DOCUMENTS 9,065,421 B2 *   6/2015   Feng ................. H03H 9/173
2011/0193495 A1 *  8/2011  Mishima ............ H02M 3/1588
                                                      315/307

OTHER PUBLICATIONS

H. Nakazawa et al., "Micro-DC/DC Converter that Integrates Planar Inductor on Power IC", IEEE Transactions on magnetics, vol. 36, No. 5, Sep. 2000.*
S. Krishnaswamy et al., "Film Bulk Acoustic Wave Resonator Technology", IEEE Ultrasonics symposium, pp. 529-536, 1990.*
(Continued)

*Primary Examiner* — Timothy J Dole
*Assistant Examiner* — Carlos Rivera-Perez
(74) *Attorney, Agent, or Firm* — Michael Best & Friedrich LLP (57) ABSTRACT

An on-chip power converter and an on-chip switching power supply implemented using a film bulk acoustic resonator (FBAR) in place of an inductor. This MEMS device offers high inductance density and high Q factor. FBARs can be conveniently fabricated in a CMOS compatible process. FBARs also shows better EMI results than conventional inductors.

19 Claims, 13 Drawing Sheets

(56) References Cited

OTHER PUBLICATIONS

K. Koo et al., " Measurement and Analysis of Vertical Noise Coupling on Low Noise Amplifier from On-chip Switching-mode DC-DC converter in 3D-IC", IEEE, 2011.*
J. T. DiBene, et al., "A 400 Amp fully Integrated Silicon Voltage Regulator with in-die magnetically coupled embedded inductors," Applied Power Electronics Conference—Special Presenation, 2010.
G. Schrom, et al., "A 60MHz 50W Fine-Grain Package Integrated VR Powering a CPU from 3.3V," Applied Power Electronics Conference—Special Presentation, 2010.
D. S. Gardner, G. Schrom, F. Paillet, B. Jamieson, T. Karnik, and S. Borkar, "Review of on chip inductor structures with magnetic films," IEEE Trans. Magn, vol. 45, No. 10, pp. 4760-4766, Oct. 2009.
C. O. Mathuna, N. Wang, S. Kulkarni, S. Roy, "Review of integrated magnetic for power supply on chip (PwrSoC)," IEEE Tran. Power Elect., vol. 27, No. 11, Nov. 2012.
R. Meere, T. O. Donnell, N. Wang, N. Achotte, S. Kulkarni, S. C. O. Mathuna, "Size and performance tradeoffs in micro-inductors for high frequency DC-DC conversion," IEEE Tran. Power Elect., vol. 45, No. 10, Oct. 2009.
C. R. Sullivan, "Integrating magnetics for on-chip power: Challenges and opportunities," in Proc. IEEE Custom Integr. Circuits Conf., pp. 291-298, Sep. 2009.
R. Meere, N. Wang, T. O'Donnell, S. Roy, and S. C. O'Mathuna, "Magnetic-core and air-core inductors on silicon: A performance comparison upto 100 MHz," IEEE Trans. Magn., vol. 47, No. 10, pp. 4429-4432, Oct. 2011.
E. L. Horsley, M. P. Foster, D. A. Stone, "State of the art piezoelectric transformer technology," 10 pages, 2007.
R.-L. Lin, "Piezoelectric transformer characterization and application ofelectronic ballast," Ph.D. dissertation, Dept. Electr.Comput. Eng.,Virginia Polytechnic Institute and State University, 171 pages, 2001.
E.M.Baker,W.Huang, D.Y. Chen, and F. C. Lee, "Radial mode piezoelectric transformer design for fluorescent lamp ballast applications," IEEE Trans. Power Electron., vol. 20, No. 5, pp. 1213-1220, Sep. 2005.
M. S. Rodgaard, M, Weirich, M. A. E. Andersen, "Forward conduction mode controlled piezoelectric transformer based PFC LED driver," IEEE Trans. Power Electron., vol. 28, No. 10, pp. 4841-4849, Oct. 2013.

C.T.C. Nguyen, "MEMS technology for timing and frequency control," IEEE Transactions on Ultrasonics, Ferroelectrics, and frequency control, vol. 54, No. 2, 20 pages, Feb. 2007.
D. E. Serrano, R. Tabrizian, and F. Ayazi, "Tunable piezoelectric MEMS resonators for real-time clock," in Proc. Joint IEEE Int. Frequency Control Symp. European Frequency and Time Forum, pp. 765-768, 2011.
G. K. Ho, R. Abdolvand, A. Sivapurapu, S. Humad, and F. Ayazi, "Piezoelectric-on-silicon lateral bulk acoustic wave micromechanical resonators," J. Microelectromech. Syst., vol. 17, No. 2, pp. 512-520, 2008.
A. K. Samarao, G. Casinovi, and F. Ayazi, "Passive TCF compensation in high Q silicon micromechanical resonators," in IEEE Int. Conf. Micro Electro Mechanical Systems, pp. 116-119, 2010.
S. H. Lee, J. Cho, S. W. Lee, M. F. Zaman, F. Ayazi, and K. Najafi, "A low-power oven-controlled vacuum package technology for highperformance MEMS," in IEEE Int. Conf. Micro Electro Mechanical Systems, pp. 753-756, 2009.
K. Sundaresan, G. Ho, S. Pourkamali, and F. Ayazi, "Electronically temperature compensated silicon bulk acoustic resonator reference oscillators," IEEE J. Solid-State Circuits, vol. 42, No. 6, pp. 1425-1434, 2007.
W. Pan and F. Ayazi, "Thin-film piezoelectric-on-substrate resonators with Q enhancement and TCF reduction," in IEEE Int. Conf. Micro Electro Mechanical Systems, pp. 104-107, 2010.
G. Piazza, P.J. Stephanou, A.P. Pisano, "Piezoelectric Aluminum Nitride Vibrating Contour-Mode MEMS Resonators", Journal of MicroElectroMechanical Systems, vol. 15, No. 6, pp. 1406-1418, Dec. 2006.
G. Piazza, P.J. Stephanou, A.P. Pisano, "One and two port piezoelectric higher order contour-mode MEMS resonators for mechanical signal processing", Solid-State Electronics, vol. 51, pp. 1596-1608, 2007.
G. Piazza and A.P. Pisano, "Two-port stacked piezoelectric aluminum nitride contour-mode resonant MEMS", Sensors and Actuators A-Physical, vol. A 136, pp. 638-645, 2007.
G. Piazza, P.J. Stephanou, A.P. Pisano, "Single-Chip Multiple-Frequency AIN MEMS Filters Based on Contour-Mode Piezoelectric Resonators", Journal of MicroElectroMechanical Systems, vol. 16, No. 2, pp. 319-328, Apr. 2007.

* cited by examiner

ON-CHIP POWER CONVERTER CIRCUIT AND ON-CHIP POWER SUPPLY USING THE POWER CONVERTER CIRCUIT

BACKGROUND

The invention relates to power converter circuits and switching power supplies.

The idea of "power supply on chip" or "system on chip" for high power conversion is a relatively recent idea. However, no single on-chip power converter has been reported in literature yet offering simultaneous high efficiency and adjustable conversion ratio. Integrated voltage regulators (IVR) are promising because they offer dynamically scalable power supplies in a cost effective manner. Switched capacitor IVRs can provide high efficiencies at reasonable current densities; however, achieving dynamic conversion ratio is very challenging with switched capacitor IVRs. Switched inductors converters (such as a buck converter) can provide high efficiency, high current density as well as offer continuous range of conversion. The bottleneck of this switched inductor IVR is the integration of power inductors on silicon.

In recent days, on chip inductors having spiral geometry and fabricated without magnetic materials exhibit inductances ranging from 1-10 nH. The densities of these inductors are lower than 100 nH/mm$^2$; occupying a large substrate area. In order to fabricate a magnetic film that is compatible with standard CMOS processing technology is a challenging task. The magnetic material should have high temperature stability, a good deposition and etching technique, and compatibility with Si technology. Moreover, increasing inductance typically involves increasing the magnetic film thickness, which eventually results in increased eddy currents; therefore the peak quality factor is compromised. High quality factor inductors seem to have lower inductance density too. Therefore, significant research is still in place to design on-chip inductors with a high quality factor and small footprint.

SUMMARY

Different magnetic materials such as Co—Zr—Ta, Ni—Fe, etc. have been investigated for on-chip inductors. In addition, a number of coil and winding geometries such as spiral, stripe, toroidal, solenoid, etc. have been investigated as well. In this regard, a completely different device such as a film bulk acoustic resonator (FBAR) has been considered as a potential candidate as a replacement of on-chip inductors in power conversion applications.

In one embodiment, the invention provides a high-power (e.g., 5-10 W), low-frequency FBAR (less than 10 MHz) and an LED driver circuit utilizing the FBAR. Therefore, no inductors will be used in the switching converter (i.e., the LED driver) resulting in a significant reduction in electromagnetic interference (EMI). Because the FBAR could be fabricated in silicon, it will be possible to integrate the FBAR and other components of the driver on a single substrate leading to a converter on chip. This virtually EMI-free LED driver could be beneficial in an environment where EMI produced from multiple LED drivers could interfere with other critical equipment. Several suitable examples would be lighting in hospitals, navy ships, commercial/military aircraft and so on. In addition to LED drivers, FBAR based resonant converters could be used in many other applications including inductive power transfer.

In another embodiment, the invention provides an on-chip power converter circuit. The converter circuit receives a direct current (DC) voltage from a power supply and provides a switched power to a load. The converter circuit includes a substrate and one or more switches fabricated on the substrate. The one or more switches are connectable to the power supply to receive the DC voltage and are controllable to provide a variable voltage with a frequency. The converter circuit further includes a film bulk acoustic resonator (FBAR) fabricated on the substrate, coupled to the one or more switches, and operable to receive the variable voltage. The FBAR provides the switched power near a resonant frequency of the FBAR.

In yet another embodiment the invention provides an on-chip switching power supply having the converter circuit with the FBAR.

Other aspects of the invention will become apparent by consideration of the detailed description and accompanying drawings.

DETAILED DESCRIPTION

Before any constructions of the invention are explained in detail, it is to be understood that the invention is not limited in its application to the details of construction and the arrangement of components set forth in the following description or illustrated in the following drawings. The invention is capable of other constructions and of being practiced or of being carried out in various ways.

Advances in MEMS design and fabrication enabled growth of piezoelectric resonators that can span a frequency range from tens to hundreds of MHz on a single substrate. FBARs are resonant piezoelectric devices fabricated on Si, and longitudinal thickness vibration of the piezoelectric layer is utilized in FBAR devices. A mechanical motion is produced in the piezoelectric layer when an RF signal is applied across the device. The fundamental resonance is observed when the thickness of the film is equivalent to half the wavelength of the RF signal. Therefore, $$v = \sqrt{\frac{E}{p}} \text{ and } f = \frac{v}{2d},$$

where E, p, d, and v are the elastic constant, density, thickness, and acoustic velocity of the film and f is the resonant frequency of the FBAR. The quality factor of the FBAR is significantly higher than the discrete L-C resonators and ceramic resonators. For example, the highest achieved quality factor for an on-chip inductor is in the range of 50-60, whereas the quality factor of a MEMS resonator can be in the thousands and even as high as 10,000.

The FBAR is attractive as an on chip resonator for different reasons, including: 1) compatibility of FBAR devices with silicon and silicon processes, 2) the acoustic and electrical properties of piezoelectric material (such as AlN and ZnO) are very attractive, and 3) the plate capacitor of the device ensures good performance against ESD and EMI compared to discrete L-C resonators.

Compared to ceramic resonators and discrete L-C resonators, FBARs can provide exceptionally high Q in a comparatively smaller area. In addition, FBAR offers simple fabrication processing that is compatible with existing Si CMOS processing. Metal deposition, lithography, and etching are widely used processes in CMOS, and FBAR fabrication would require just one additional step, which is the deposition of the piezoelectric film. Another benefit of on-chip FBAR is that losses due to energy leakage into the silicon are restricted to only the anchor points.

Figure 1:
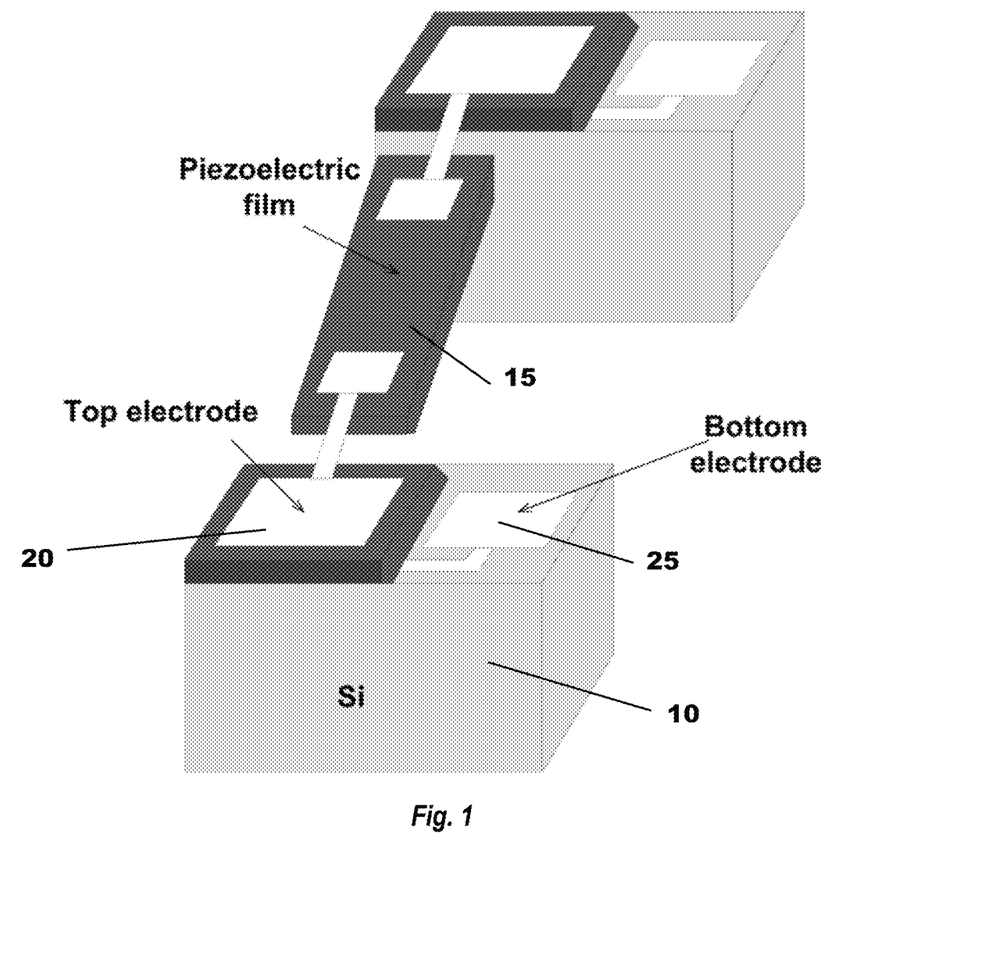
FIG. 1 represents a structural layout of an FBAR.
Figure 2:
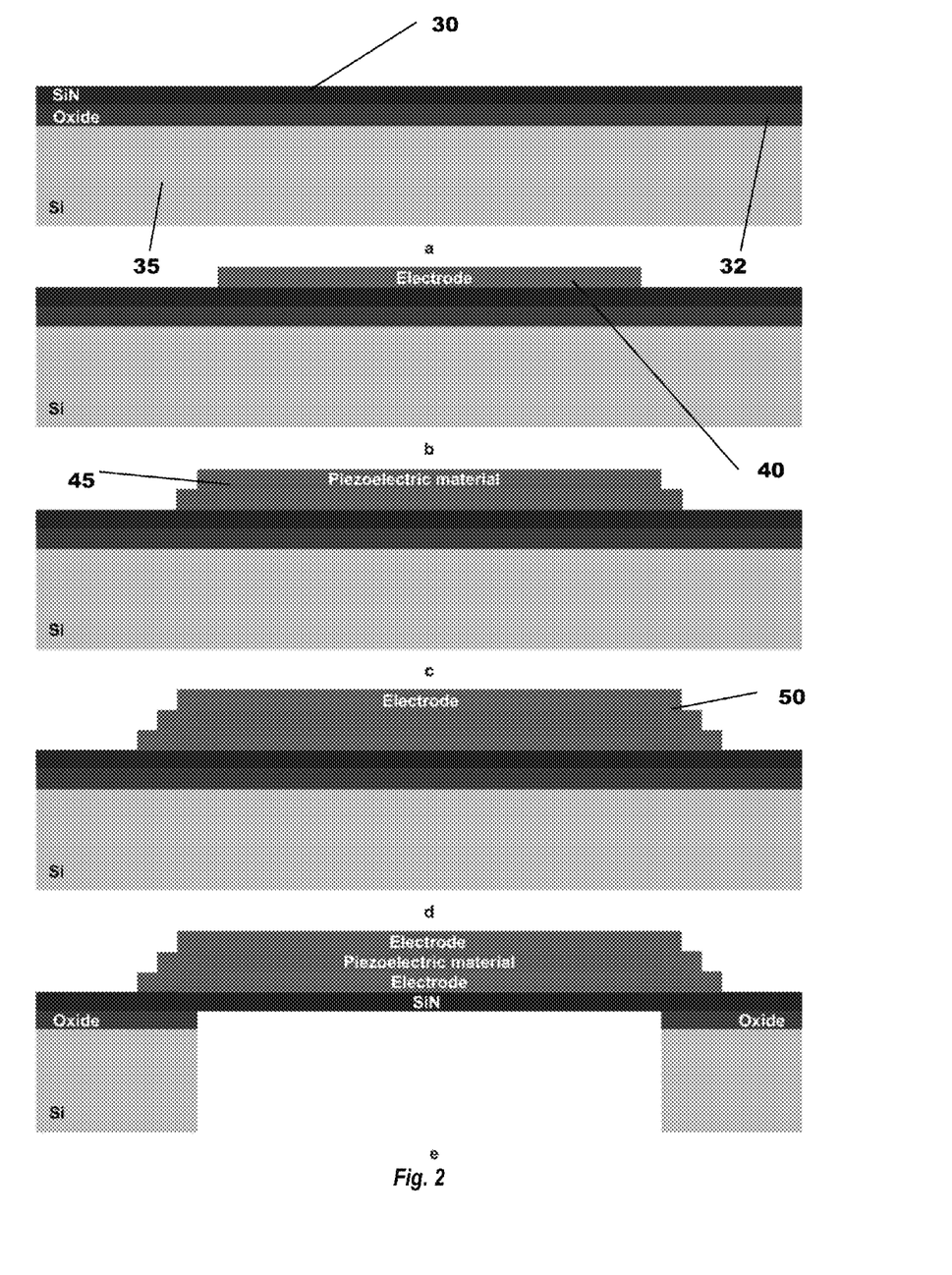
FIG. 2 represents a fabrication process flow of an FBAR.

A typical structural layout of an FBAR 10 is shown in FIG. 1. The FBAR 10 includes a piezoelectric film 15, a top electrode 20, and a bottom electrode 25. Numerous variations in the fabrication processes of FBAR can be found in the prior art. A typical four-mask process is outlined in FIG. 2, which is fully compatible with the standard CMOS fabrication process. Step (a) represents deposition of SiN 30 and oxide 35 on Si 35. Step (b) represents deposition and patterning of a bottom electrode 40. Step (c) represents deposition and patterning of piezoelectric material 45. Step (d) represents deposition and patterning of a top electrode 50. Step (e) represents back side DRIE (deep reactive ion etching) and the final device cross section. AlN piezoelectric material 45 is deposited between two electrodes 40 and 50 and this structure is released by DRIE. Therefore, the structure can resonate at a specific frequency.

Figure 3A:
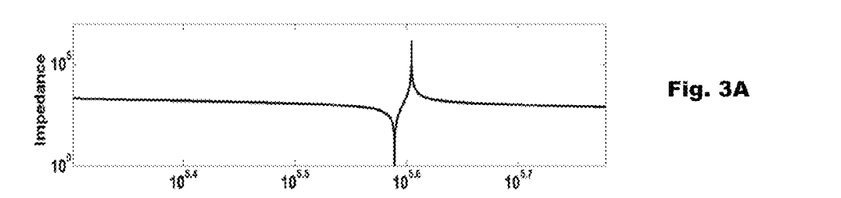
FIGS. 3A and 3B provide graphs of impedance and phase characteristics, respectively, versus frequency for an FBAR.
Figure 3B:
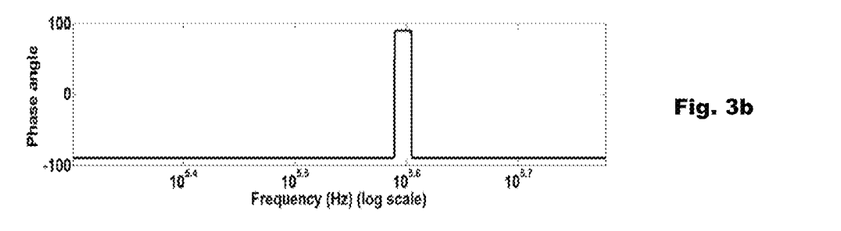
Figure 4:
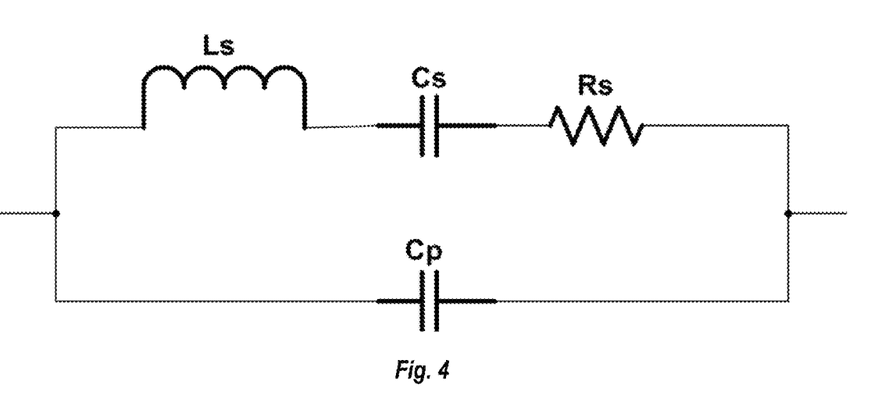
FIG. 4 is an electrical equivalent circuit of an FBAR.

The impedance and phase characteristics between two electrodes, such as electrodes 40 and 50, of a resonator are shown in FIG. 3. FIG. 3 indicates that the device behaves like a capacitor below the resonant frequency (Fr) (the phase angle is around −90); the impedance becomes the lowest at resonant frequency (Fr). FBAR behaves like an inductor between resonant frequency (Fr) and anti-resonant frequency (Fa) (the phase angle is around 90). The impedance is the maximum at the anti-resonant frequency (Fa), and the FBAR is again capacitive beyond the anti-resonant frequency (the phase angle is around −90). This behavior can be modeled using an electrical circuit shown in FIG. 4. If the resistance Rs is omitted from the equivalent circuit, the impedance between two terminals of the FBAR can be expressed in the following way:

$$Z(\omega) = \frac{j\left(\omega Ls - \frac{1}{\omega Cs}\right)}{1 + \frac{Cp}{Cs} - \omega^2 CpLs}$$

From this expression the resonant frequency and anti-resonant frequency can be obtained as $$Fr = \frac{1}{2\pi\sqrt{LsCs}} \text{ and } Fa = Fr\sqrt{1 + \frac{Cs}{Cp}},$$

respectively. If the frequency is between Fr and Fa, the equivalent impedance of FBAR is given as $$Z(\omega) = Rse + j\omega Lse,$$

which means that FBAR should behave like an inductor Lse (H) with a loss component Rse (Ω).

Figure 5:
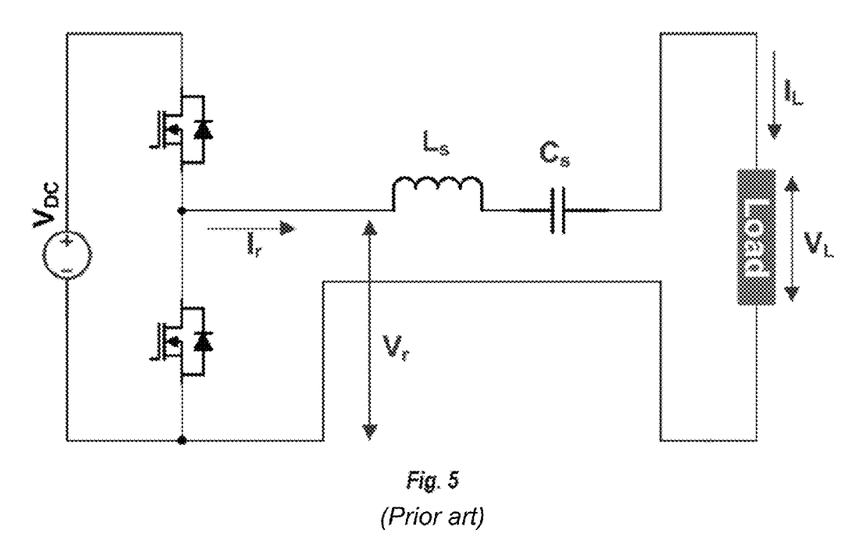
FIG. 5 is a schematic of a half bridge series resonant inverter with discrete components.
Figure 6:
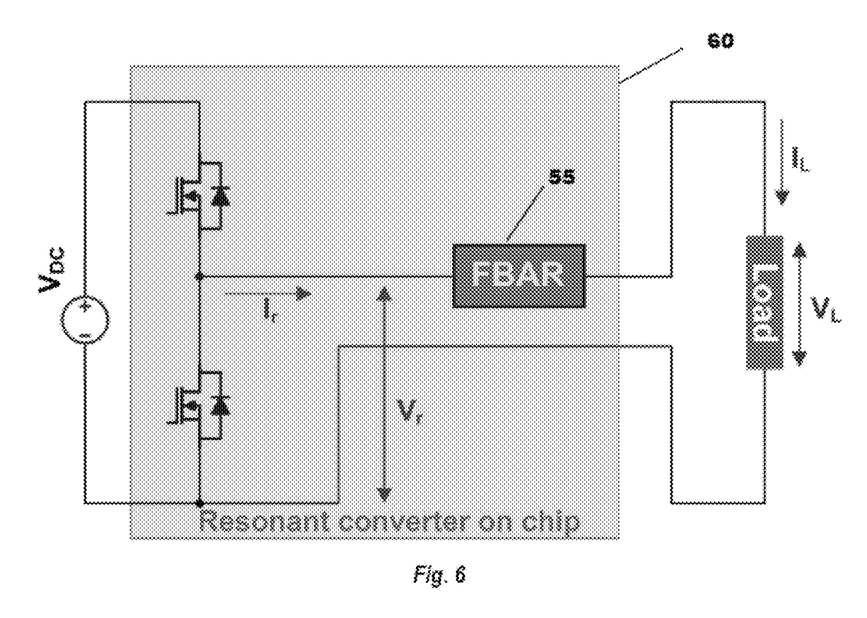
FIG. 6 is a schematic of a half bridge series resonant inverter incorporating FBAR.
Figure 7:
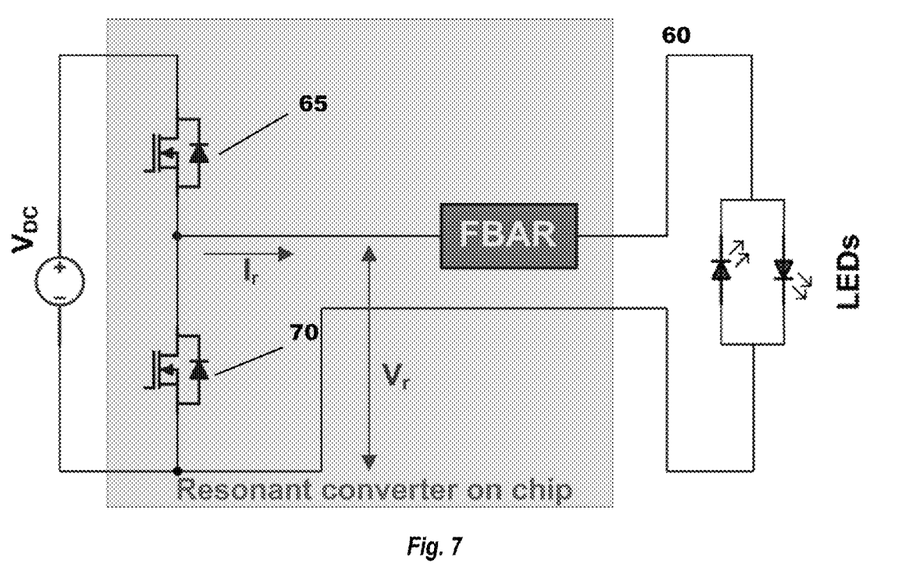
FIG. 7 is a schematic of a half bridge series resonant inverter incorporating FBAR for driving LEDs.

FBAR, being a MEMS resonator, can be used in different resonant converters for power conversion. Resonant converters offer high efficiency and less EMI compared to conventional inductor based converters. A schematic of a conventional series resonant inverter is shown in FIG. 5, and this type of resonator circuits are widely used in LCD display drivers, electrode less fluorescent light (EFL) drivers, etc. The discrete inductor and capacitor in a series resonant inverter can be replaced by an FBAR 55 (FIG. 6); therefore a power converter can be implemented without any discrete components. This series resonant converter circuit 60 can be modified to drive an LED string as shown in FIG. 7. Because of the FBAR 55, power switches 65 and 70 and power switch driver(s) can be fabricated in a CMOS compatible process. Inclusion of the FBAR 55 can lead to a power supply on chip (PwrSoC) 75, which is still challenging for power electronics. However, FBARs are widely used in CDMA handsets as duplexers and the power rating of the available FBARs are usually low—in the range of mW. An example implementation of FBAR for power conversion is discussed below in further detail.

Recent advancements in power GaNFETs and SiCFETs contributed to the increment of the operating frequency to the MHz region. Moreover, up until now, only high frequency FBARs in the GHz range are available. Because of these issues (low power and high switching frequency), it is a challenging task to verify the operation of a series resonant inverter using FBARs. However, piezoelectric ceramic material based resonators are commercially available with frequencies in the range of hundreds of kHz. Ceramic based resonators are suitable for circuit implementation using EPC's GaNFETs prototype half-bridge board. The piezoelectric resonator uses a piezoelectric material film, and this is the only difference between these resonators and FBARs. In an FBAR, the piezoelectric material is deposited using sputtering or chemical vapor deposition (CVD)—a very common CMOS process step. Whereas, two electrodes are attached to an already available piezoelectric material chuck in commercially available resonators, and precision fabrication is not mandatory because the piezoelectric material is not a thin film, unlike FBARs. Therefore, the electrical characteristics of an FBAR are comparable to that of a resonator.

Figure 8:
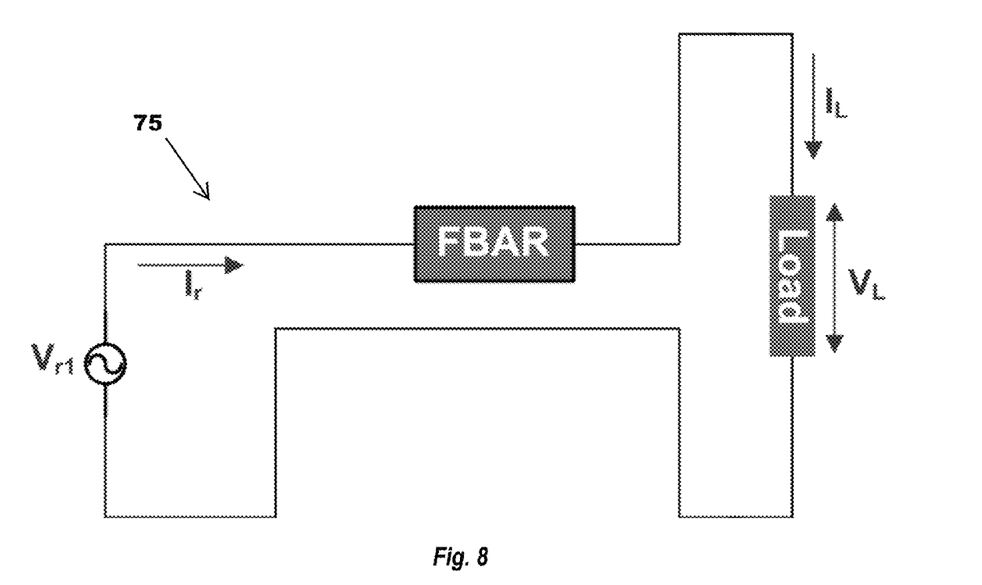
FIG. 8 is a simplified schematic of FIG. 6 when the switching frequency is very close to the resonant frequency of the FBAR.

In one example, a resonator from Murata electronics with part number CSBLA400KECE-B0 was used to verify the FBAR concept. The frequency response of this resonator is similar to FIG. 3, as obtained from the datasheet. The parameters of this resonator with reference to FIG. 4 are: Ls=6.7041 mH, Cs=25.0462 pF, Rs=6.2Ω, and Cp=344.3647 pF with resonance frequency of 389.4 kHz approximately. From FIG. 3, it can be observed that the impedance of the FBAR is very low at resonant frequency, and the impedance is very high when the frequency is slightly higher or lower than the resonant frequency. Therefore, if the switches in the resonant inverter are operated very close to the resonant frequency of the FBAR, only the fundamental component of $V_r$ can be passed through the FBAR. Therefore, the equivalent circuit of FIG. 6 can be expressed as shown in FIG. 8. $V_{r1}$ can be defined as:

$$V_{r1} = \frac{2}{\pi}\sin(\pi D)V_{DC}\sin(\omega t),$$

where, D is the duty ratio of the switches and $\omega=2\pi f$, where f is the switching frequency. Accordingly, $$V_{r1}(RMS) = \frac{2}{\pi\sqrt{2}}\sin(\pi D)V_{DC},$$

and therefore, $$I_r(RMS) = \frac{V_{r1}(RMS)}{|Z_{FBAR}| + |Z_{LOAD}|} \quad \text{EQN (1)}$$

where $$Z_{FBAR}(\omega) = \frac{Rs + j\left(\omega Ls - \frac{1}{\omega Cs}\right)}{-\left(\omega Ls - \frac{1}{\omega Cs} - \frac{1}{\omega Cp}\right)(\omega Cp) + j(Rs\omega Cp)} \quad \text{EQN (2)}$$

Using EQN (1), the load voltage and current can be controlled by controlling the switching frequency f and duty ratio D. However, the requirement for keeping the switching frequency close to the resonant frequency imposes restrictions on the controllability of the circuit in FIG. 8. If the load varies widely, proper control may not be realized in the circuit which results in poor stability. The minimum impedance of the FBAR is $|z(\omega)_{min}|=Rs$ (from EQN (2)), this resistance leads to the lower efficiency of FBAR based resonant converters compared to the discrete components based resonant converters. Interestingly, FBAR with very low Rs (0.16Ω) have been reported. Therefore, implementation of a high efficiency resonant converter based on FBAR is possible.

The FBAR behaves like an inductor when the switching frequency is higher than the resonant frequency (FIG. 3), meaning zero voltage switching operation (ZVS) is possible. If the switching frequency is slightly lower than resonant frequency, then zero current switching (ZCS) is possible for the series resonant inverter (FBAR behaves like a capacitor—FIG. 3).

Figure 9:
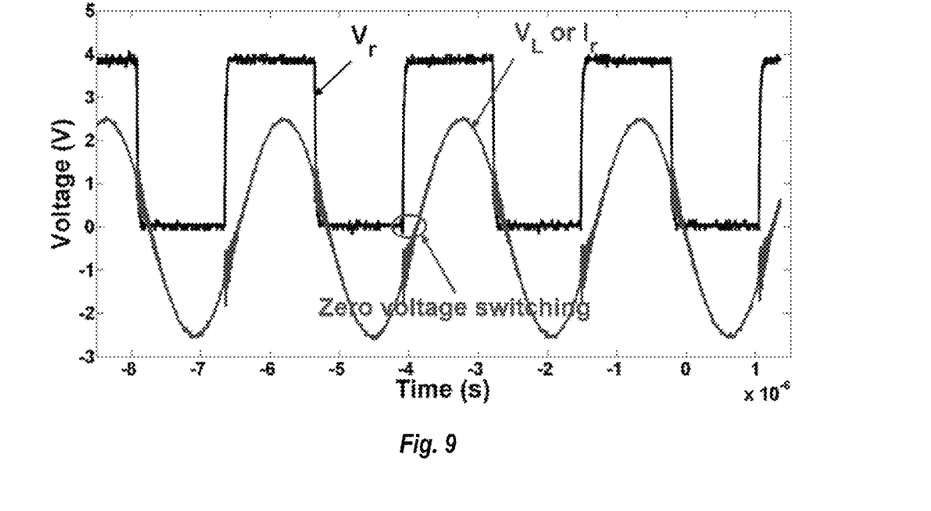
FIG. 9 is a voltage versus time graph showing experimental results of the ZVS operation of a half bridge series resonant inverter using a ceramic resonator.
Figure 10:
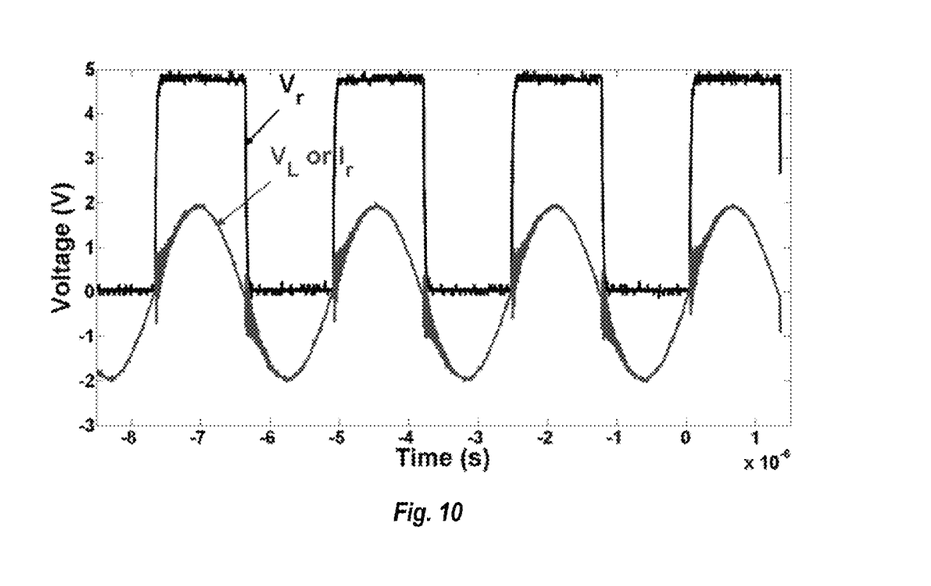
FIG. 10 is a voltage versus time graph showing experimental results of the ZCS operation of the half bridge series resonant inverter using a resonator.
Figure 11:
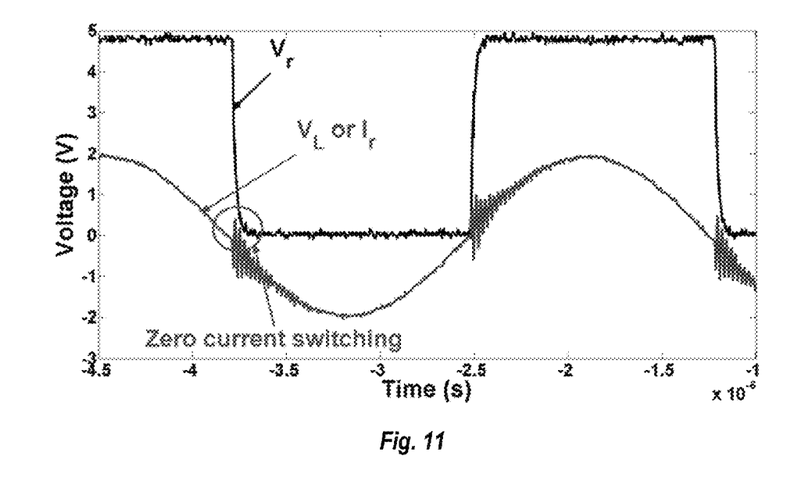
FIG. 11 is an enlarged version of FIG. 10.

To initially prove the concept of FBAR based power conversion, a commercial resonator CSBLA400KECE-B0 was used (discussed earlier). In order to meet the 389.4 kHz switching requirement for the EPC 2015, GaNFET and a corresponding half bridge driver IC LM5113 were chosen. The EPC9001 development board comes with these FETs and onboard gate driver in a half bridge architecture. This half bridge circuit was connected to a PCB containing only a FBAR and a load (purely resistive). A pulse-train with 0.5 duty ratio was applied to the circuit from a function generator (Agilent 33521 A). The experimental results are shown in FIG. 9 (experimental data was captured with a Tektronix TPS 2024B oscilloscope and plotted using MATLAB). The output voltage $V_L$ and current $I_r$ or $I_L$ had the same waveform because of the resistive load. The switching frequency in FIG. 9 was 389.5 kHz (slightly higher than 389.4 kHz). Therefore, ZVS was observed in FIG. 9. Similarly, with 389.3 kHz switching frequency (lower than 389.4 kHz) ZCS was observed (FIG. 10). The output waveform has low distortion even though there is high frequency noise in the input. This small distortion at the output can be cancelled using a high frequency rejection capacitor. The efficiency of the circuit varies from 75%-85% depending on the load (measured using a Fluke 8846A precision multimeter). The efficiency is lower because the resonator used in the experiment has very high Rs (Rs=6.2Ω). Due to the low power level of the resonator used in the circuit, the maximum load power was less than 500 mW.

Figure 12:
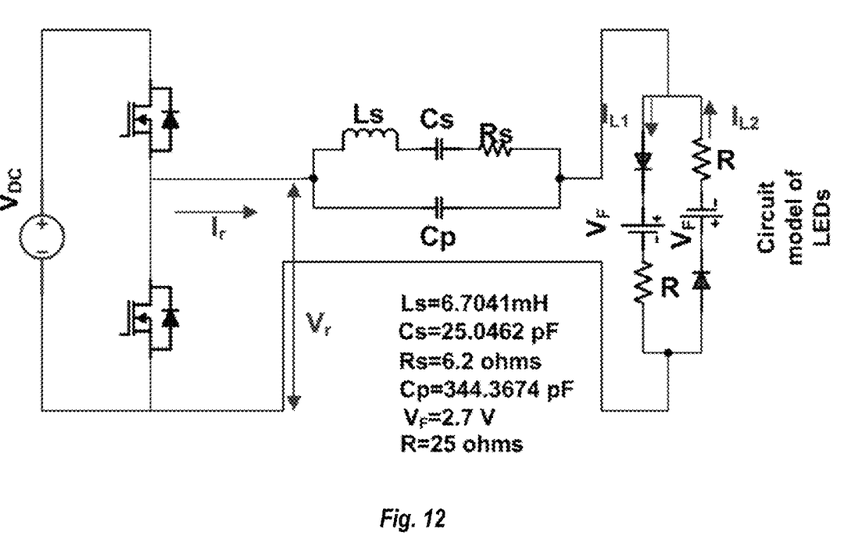
FIG. 12 is a schematic of a circuit used in PSIM simulation
Figure 13A:
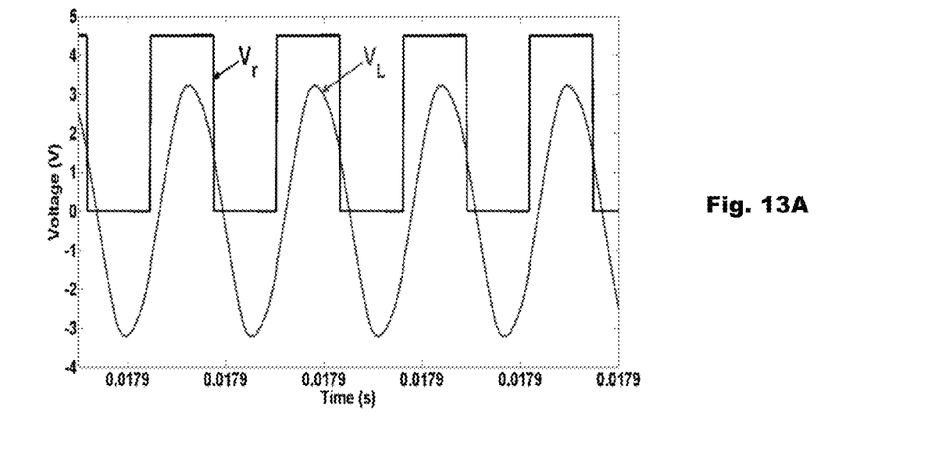
FIGS. 13a and 13b are voltage and current versus time graphs, respectively, of the PSIM simulation results of the circuit shown in FIG. 12.
Figure 13B:
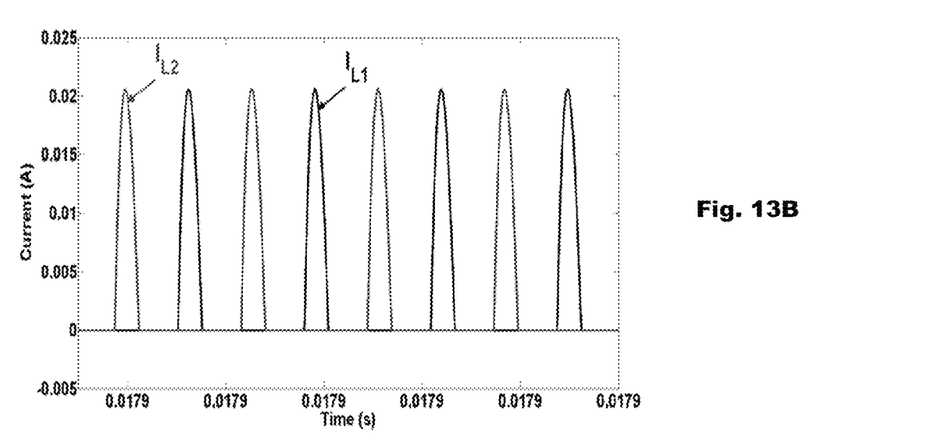

Existing FBARs or commercially available resonators are not suitable for high power conversion. To the knowledge of the inventors, an FBAR capable of handling power up to 4 W has not been fabricated till date. With the advancement of LED devices, an LED driver with less than 10 W rating is suitable for many applications. Therefore, an FBAR based converter can be implemented as low power LED drivers by connecting converters in an interleaved fashion. In order to validate this concept, the half bridge series resonant converter was modified from FIG. 7 to as shown in FIG. 12. The circuit shown in FIG. 12 was simulated using PSIM, where FBAR is replaced with the equivalent circuit model described previously and the piecewise linear model of an LED (an ideal diode, a voltage source, and a resistor) was used (the parameters of the model were extracted from the datasheet of the LED used in the experiment). The simulation results have been included in FIG. 13. The switching frequency was 389.5 kHz (higher than the resonant frequency).

Figure 14:
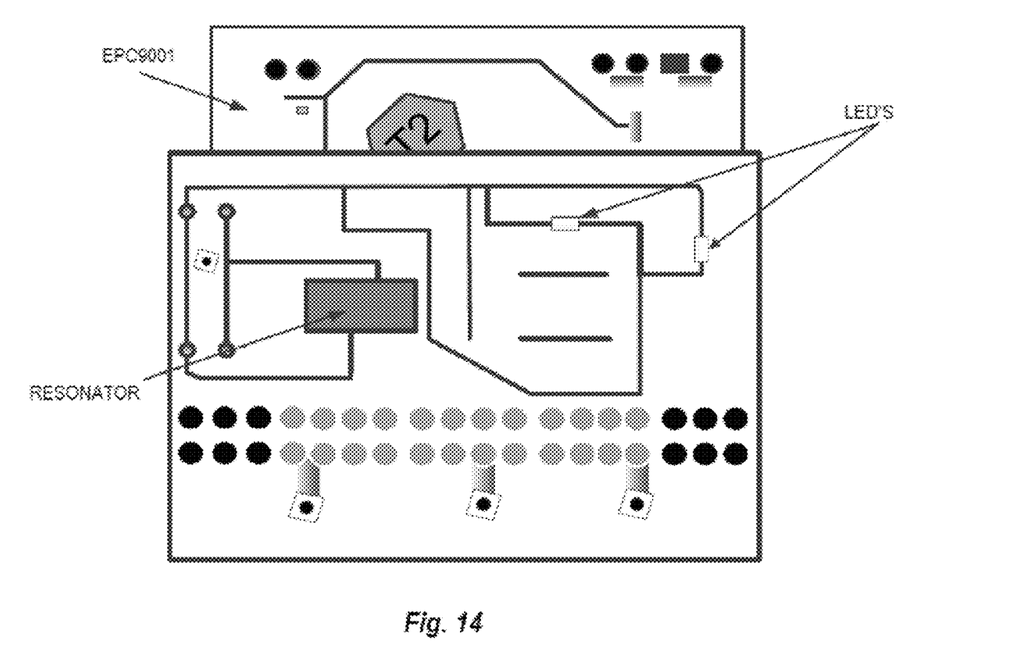
FIG. 14 is a top view of a prototype of the FBAR based series resonant inverter as an LED driver.
Figure 15:
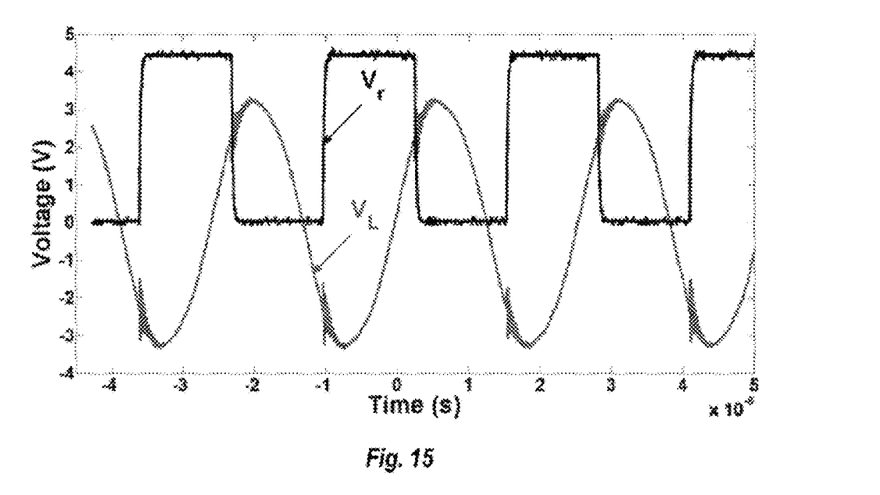
FIG. 15 is a voltage versus time graph showing experimental results of the FBAR based LED driver in FIG. 14.
Figure 16:
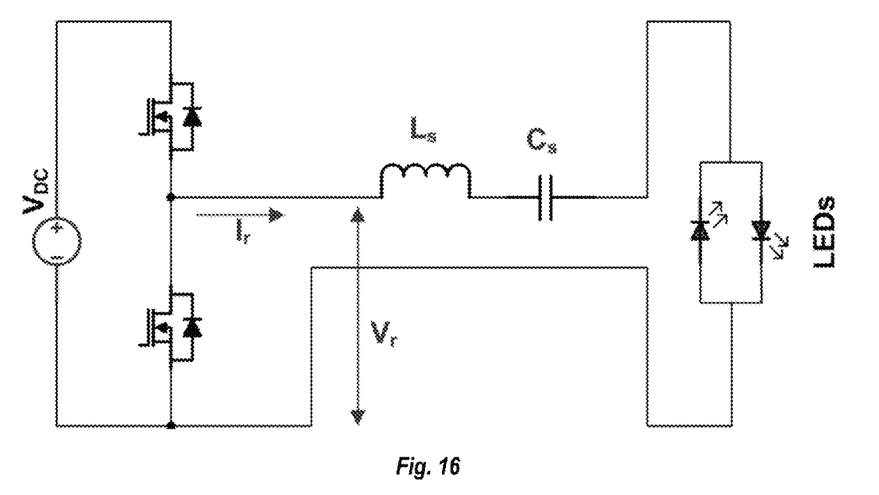
FIG. 16 is a schematic of the discrete L-C components based series resonant inverter as an LED driver.
Figure 17:
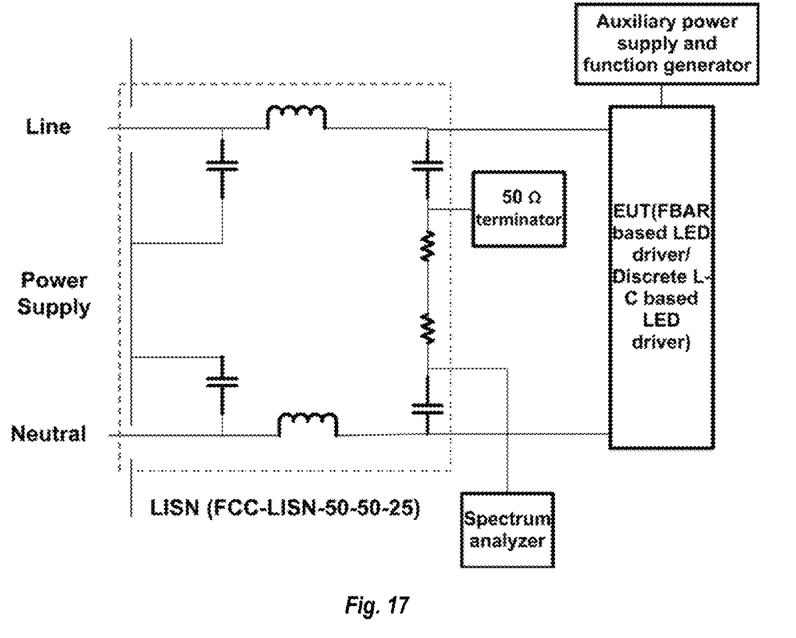
FIG. 17 is a schematic of the experimental setup used for EMI measurement.
Figure 18A:
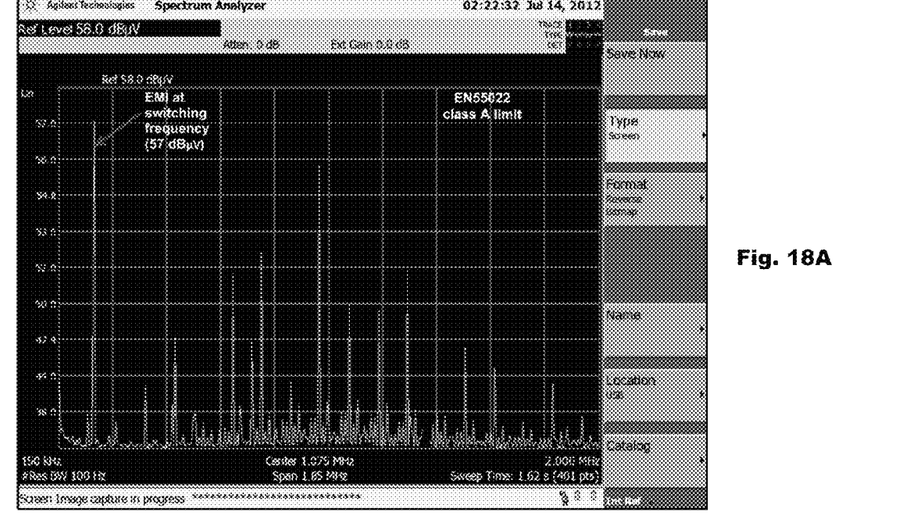
FIGS. 18A and 18B are screen prints of a spectrum analyzer for a conducted EMI comparison of the discrete L-C series resonant converter and FBAR based series resonant converter.
Figure 18B:
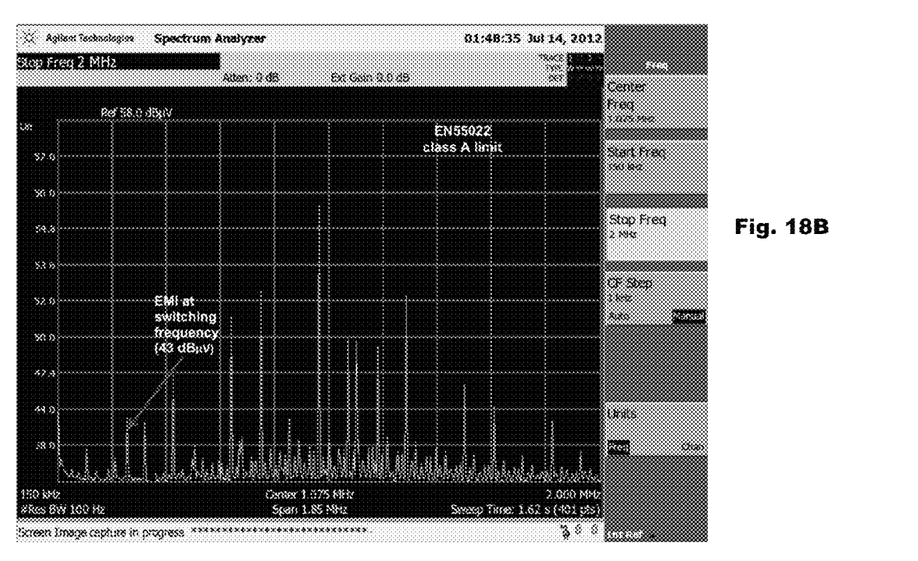

Low power LEDs were chosen for implementation because the resonator is a low power device. FIG. 14 shows the prototype where the PCB with resonator (CSBLA400KECE-B0) and LEDs have been inserted into the EPC9001 board. The switching frequency was 389.5 kHz to achieve ZVS, and the experimental results for this case are depicted in FIG. 15. The EMI measurement of the prototype shown in FIG. 14 was performed and compared to that of a discrete L-C series resonant inverter LED driver (the schematic of this circuit is given in FIG. 16). The schematic of the experimental set up for conducted EMI measurement is shown in FIG. 17. The supply lines pass through a LISN (line impedance stabilization network) to the converter and the output of the LISN is connected to a spectrum analyzer (such as Agilent E4404B ESA). The results from the spectrum analyzer are shown in FIGS. 18A and 18B. The noise levels at switching frequency and its odd harmonics frequencies are lower for the FBAR based converter. The noise level at switching frequency is much higher in discrete components circuit compared to that of FBAR based converter. From FIGS. 18A and 18B it is clear that the HF emissions in dB μV of both the converters are below EN55022 (CISPR 22) class A limit. However, the EMI performance of FBAR based converter is better than the converter made from discrete components (the noise level at switching frequency is significantly higher in the conventional non-FBAR circuit compared to that of an FBAR based converter). Therefore, an FBAR based resonant converter has the potential to be the optimum solution in critical high-power applications (such as Navy ships, aircraft and various military use) without compromising the EMI performance.

FBAR has the potential to solve the fabrication challenges of high density and high quality factor inductors on Si. Presently, 2-5 μH/mm$^2$ is highest achieved inductance density for an on-chip power conversion, where as more than 100 μH/mm$^2$ inductance density can be achieved using a MEMS resonator. LED drivers can be a potential application of the FBAR based series resonant inverter. Experimental results of both FBAR and non-FBAR circuits have been provided. The preliminary EMI performance of the FBAR based converter is superior to that of a conventional L-C based driver.

Figure 19:
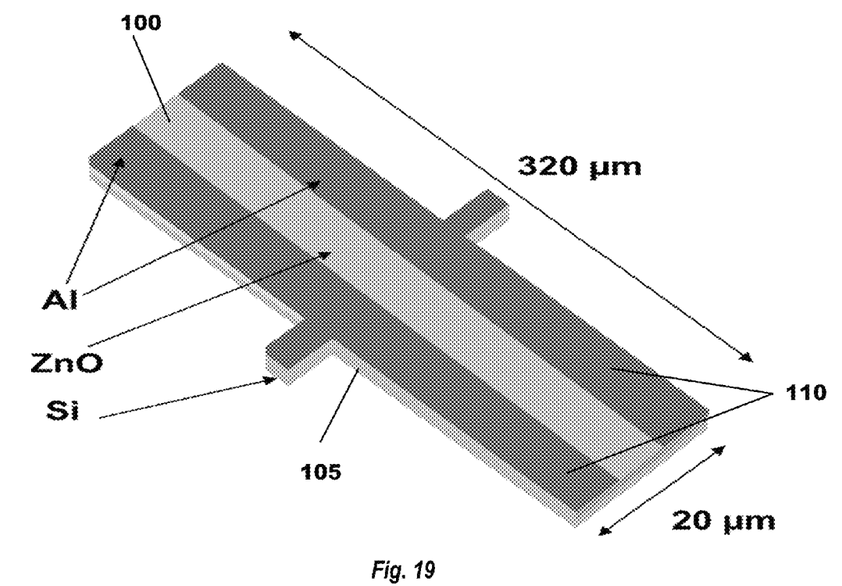
FIG. 19 is a perspective view of a proposed low frequency MEMS resonator device structure designed in COMSOL Multiphysics software.

In addition to the above, the inventors designed a low-frequency high-power FBAR that could be suitable to use in switched power supplies. For power conversion purposes, we it is preferred to have an FABR with a reasonably small resonant frequency. A suitable device structure is shown in FIG. 19. This structure takes advantage of the length extensional mode of vibration, and therefore, the length of the device structure is the primary factor that determines the frequency. A sufficiently long structure can achieve low resonant frequency. For example, the device of FIG. 19 can achieve resonance frequency in the range of 6.31 MHz. However, the thickness of the device should be accordingly adjusted in order to support the device during resonance, and silicon on insulator (SOI) wafers can be used to provide this support. A 5 μm thick Si device layer of the SOI wafer has been used as the starting substrate for simulation in COMSOL Multiphysics. This layer is highly doped (e.g., the resistivity of the proposed Si layer is around 0.001-0.002 ohm-cm) in order to reduce the temperature co-efficient of frequency (TCF), meaning the shifting of resonance frequency with temperature can be minimized (e.g., the temperature variation could be in the range of 25 degree C. to 100 degree Celsius). This highly doped substrate acts as the ground electrode for the three terminal device. Moreover, interface mismatch between different layers can be reduced by utilizing this Si layer as a ground conductor. The mechanical damping coefficient of Si is lower than common metals used in the micro-fabrication technologies. Therefore, if Si is used as the ground electrode, it can reduce the mechanical loss resulting in achieving higher quality factor from the device.

Figure 20:
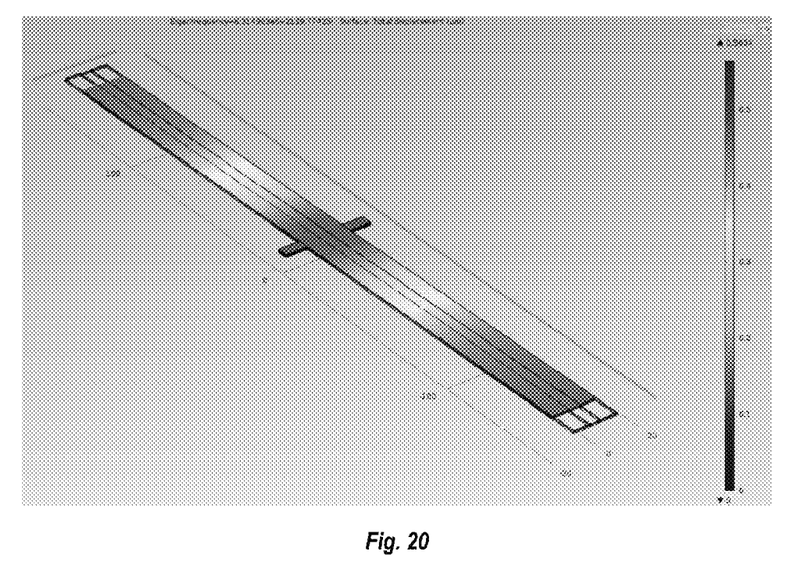
FIG. 20 is a perspective view of a modeled displacement at the fundamental frequency of resonance for the structure of FIG. 19 during eigen frequency analysis in COMSOL Multiphysics software.

With reference to FIG. 19, ZnO (as the piezoelectric film) 100 was deposited on top of Si layer 105 as shown in FIG. 19. Aluminum (Al) 110 was the top electrode metal in the device structure, and this proposed device has the dimension of 320 μm×20 μm. The device has support tether at both sides, and FIG. 20 shows the length extensional mode of the device at the fundamental frequency of resonance. The width of the device and thickness of different material layers have small effect on the fundamental resonant frequency.

Figure 21:
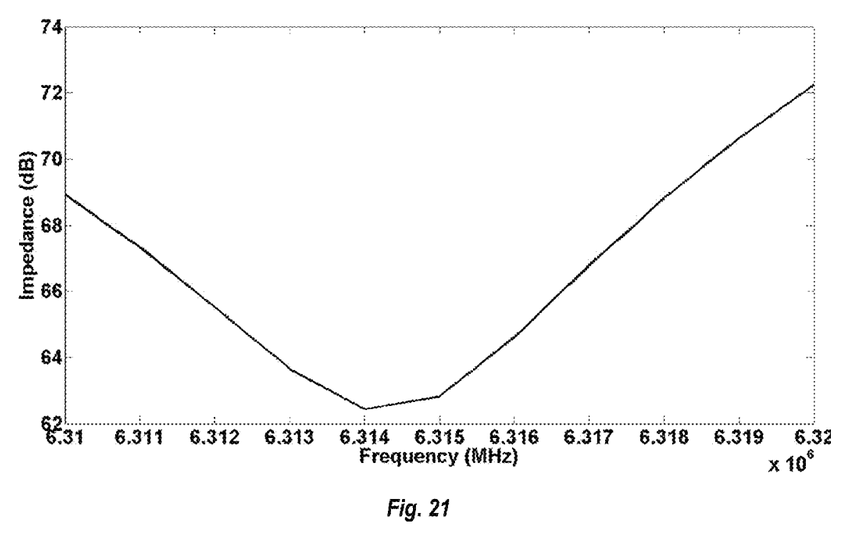
FIG. 21 is an impedance versus frequency graph of an approximate impedance response for the structure of FIG. 1 during simulation in COMSOL Multiphysics software.

The impedance response of the device centered on fundamental resonant frequency is shown in FIG. 21. The resonator behaves like an inductor when the frequency is higher than the resonant frequency. If the frequency is lower than resonant frequency, this resonator behaves like a capacitor. Thus, the shown FBAR is similar to a series R-L-C circuit.

Thus, the invention provides, among other things, a new and useful film bulk acoustic resonator (FBAR) assisted power converter circuit. Using FBAR increases the power density of the power converter while maintaining the electromagnetic interference (EMI) at the minimum. This MEMS device can offer very high inductance density with high Q factor and can be fabricated effortlessly in a CMOS compatible process. A class E amplifier, a series resonant converter, and an LED driver have been implemented by replacing the circuit inductors with FBARs. FBARs are small in size and weight compared to inductors, therefore can offer higher power density. Therefore, FBAR can be integrated with other active components in a converter circuit, and it is possible to build an entire switching power supply on a chip. Various features and advantages of the invention are set forth in the following claims.

What is claimed is:

1. An on-chip power converter circuit receiving a direct current (DC) voltage from a power supply and providing a switched power to a load, the converter circuit comprising:
   a substrate;
   one or more switches fabricated on the substrate, connectable to the power supply to receive the DC voltage, and being controllable to provide a variable voltage with a frequency;
   a film bulk acoustic resonator (FBAR) fabricated on the substrate, coupled to the one or more switches, operable to receive the variable voltage, and provide the switched power near a resonant frequency of the FBAR, the resonant frequency being less than 100M Hz;
   wherein the FBAR includes a length-extension mode of vibration that is based on a length of the FBAR, and wherein the resonant frequency of the FBAR is substantially defined by the length of the FBAR.

2. The converter circuit of claim 1 wherein the one or more switches include a plurality of switches arranged in a half-bridge configuration with a center point, and wherein the FBAR is coupled to the center point of the half-bridge configuration.

3. The converter circuit of claim 1 wherein the substrate includes silicon.

4. The converter circuit of claim 1 wherein the power supply and the load are fabricated on the substrate.

5. The converter circuit of claim 1 wherein the FBAR has a high inductance density and a high Q factor.

6. The converter circuit of claim 1 wherein the FBAR includes piezoelectric material deposited between two electrodes, the piezoelectric material, when deposited between the two electrodes, having impedance and phase characteristics of a resonator with the resonant frequency.

7. The converter circuit of claim 1 wherein the one or more switches are connectable to a driver, the driver to provide a control signal for controlling the one or more switches, resulting in the variable voltage with the frequency.

8. The converter circuit of claim 7 wherein the driver is fabricated on the substrate.

9. The converter circuit of claim 1 wherein the frequency is near the resonant frequency of the FBAR.

10. The converter circuit of claim 1 wherein the switched power is greater than 5 W.

11. An on-chip switching power supply comprising:
a substrate;
a direct current (DC) power supply fabricated on the substrate to provide a DC voltage;
one or more switches fabricated on the substrate, coupled to the DC power supply to receive the DC voltage, and being controllable to provide a variable voltage with a frequency;
a film bulk acoustic resonator (FBAR) fabricated on the substrate, coupled to the one or more switches, operable to receive the variable voltage, and provide the switched power near a resonant frequency of the FBAR, the resonant frequency being less than 100M Hz;
wherein the FBAR includes a length-extension mode of vibration that is based on a length of the FBAR, and wherein the resonant frequency of the FBAR is substantially defined by the length of the FBAR.

12. The power supply of claim 11 wherein the one or more switches include a plurality of switches arranged in a half-bridge configuration with a center point, and wherein the FBAR is coupled to the center point of the half-bridge configuration.

13. The power supply of claim 11 wherein the substrate includes silicon.

14. The power supply of claim 11 wherein the FBAR has a high inductance density and a high Q factor.

15. The power supply of claim 11 wherein the FBAR includes piezoelectric material deposited between two electrodes, the piezoelectric material, when deposited between the two electrodes, having impedance and phase characteristics of a resonator with the resonant frequency.

16. The power supply of claim 11 wherein the one or more switches are connectable to a driver, the driver to provide a control signal for controlling the one or more switches, resulting in the variable voltage with the frequency.

17. The power supply of claim 16 wherein the driver is fabricated on the substrate.

18. The power supply of claim 11 wherein the frequency is near the resonant frequency of the FBAR.

19. The power supply of claim 11 wherein the switched power is greater than 5 W.

* * * * *